United States Patent
Chang et al.

(10) Patent No.: US 9,711,606 B1
(45) Date of Patent: Jul. 18, 2017

(54) THIN FILM TRANSISTOR AND MANUFACTURING METHOD THEREOF

(71) Applicant: Chunghwa Picture Tubes, LTD., Taoyuan (TW)

(72) Inventors: Hsi-Ming Chang, Taoyuan (TW); Yen-Yu Huang, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 15/357,690

(22) Filed: Nov. 21, 2016

(30) Foreign Application Priority Data

Sep. 22, 2016 (CN) .......................... 2016 1 0840081

(51) Int. Cl.
  *H01L 29/66* (2006.01)
  *H01L 29/423* (2006.01)
  *H01L 29/786* (2006.01)
  *H01L 29/49* (2006.01)
  *H01L 21/44* (2006.01)

(52) U.S. Cl.
  CPC ........ *H01L 29/42384* (2013.01); *H01L 21/44* (2013.01); *H01L 29/4908* (2013.01); *H01L 29/66969* (2013.01); *H01L 29/7869* (2013.01); *H01L 29/78606* (2013.01); *H01L 2029/42388* (2013.01)

(58) Field of Classification Search
  CPC ......... H01L 29/42384; H01L 29/66969; H01L 29/7869; H01L 29/4908
  See application file for complete search history.

(56) References Cited

U.S. PATENT DOCUMENTS

| 8,754,410 B2 | 6/2014 | Park et al. |
| 2013/0134514 A1* | 5/2013 | Chang ............... H01L 29/78606 257/347 |
| 2013/0161625 A1* | 6/2013 | Ku ..................... H01L 27/1288 257/59 |

FOREIGN PATENT DOCUMENTS

CN     202957242     5/2013

* cited by examiner

*Primary Examiner* — Dung Le
(74) *Attorney, Agent, or Firm* — J.C. Patents (57) ABSTRACT

The manufacturing method of the thin film transistor includes the following steps. A gate, a first insulating layer, a second insulating layer, a metal oxide semiconductor layer, a first etching stop layer, a second etching stop layer and a photoresist structure are sequentially formed. The second etching stop layer, the first etching stop layer, and the metal oxide semiconductor layer are patterned using the photoresist structure as a mask to form a pre-second etching stop pattern, a pre-first etching stop pattern, and a metal oxide semiconductor pattern. The pre-second etching stop pattern and the pre-first etching stop pattern are patterned using the remaining thick portion of the photoresist structure as a mask to form a second etching stop pattern and a first etching stop pattern, and a portion of the second insulating layer is removed to form an insulating pattern. A source and a drain are formed.

9 Claims, 5 Drawing Sheets

THIN FILM TRANSISTOR AND MANUFACTURING METHOD THEREOF

CROSS-REFERENCE TO RELATED APPLICATION

This application claims the priority benefit of China application serial no. 201610840081.5, filed on Sep. 22, 2016. The entirety of the above-mentioned patent application is hereby incorporated by reference herein and made a part of this specification.

BACKGROUND OF THE INVENTION

Field of the Invention

The invention relates a semiconductor device and a manufacturing method thereof, and particularly relates to a thin film transistor and a manufacturing method thereof.

Description of Related Art

Most display panels use an amorphous silicon (a-Si) thin film transistor or a low temperature polysilicon (LTPS) thin film transistor as a switching device of a pixel structure. However, an oxide semiconductor thin film transistor has high carrier mobility compared to the amorphous silicon thin film transistor, and the oxide semiconductor thin film transistor has better threshold voltage uniformity compared to the low temperature polysilicon thin film transistor. Thus, the oxide semiconductor thin film transistor has been applied to a high-quality display panel.

To reduce a number of masks required to manufacture the oxide semiconductor thin film transistor, some people use half tone mask technology to manufacture the oxide semiconductor thin film transistor. The current manufacturing method of the oxide semiconductor thin film transistor is as follows. First, a gate is formed on a substrate. Next, a gate insulating layer is formed on the substrate to cover the gate. Then, an oxide semiconductor layer is formed on the gate insulating layer. Then, an etching stop layer is formed on the oxide semiconductor layer. Then, a photoresist structure having a thin portion and a thick portion is formed on the etching stop layer using a half tone mask. Then, the etching stop layer and the oxide semiconductor layer are patterned using the photoresist structure as a mask to form a first etching stop pattern and an oxide semiconductor pattern. Then, an ashing process is performed to remove the thin portion of the photoresist structure and retain a portion of the thick portion to expose a portion of the first etching stop pattern. Thereafter, the first etching stop pattern is patterned using the remaining thick portion of the photoresist structure as a mask to form a second etching stop pattern. The second etching stop pattern exposes two sides of the oxide semiconductor pattern. Then, the remaining thick portion of the photoresist structure is removed to expose the second etching stop pattern. Thereafter, a source and a drain are formed on the second etching stop pattern to complete the oxide semiconductor thin film transistor. However, when the first etching stop pattern is patterned to form the second etching stop pattern, a portion of the gate insulating layer not covered by the oxide semiconductor pattern will be removed, which affects the yield of the thin film transistor.

SUMMARY OF THE INVENTION

The invention provides a manufacturing method of a thin film transistor, which can improve the production of the thin film transistor.

The invention provides a thin film transistor, which can prevent a gate insulating layer from being removed, and has high yield.

The invention provides a manufacturing method of a thin film transistor including the following steps. A gate is formed on a substrate. A first insulating layer, a second insulating layer, an oxide semiconductor layer, a first etching stop layer, a second etching stop layer, and a photoresist structure are formed on the substrate and the gate sequentially. The photoresist structure has a thick portion and a thin portion, wherein the first etching stop layer and the second insulating layer have an etch selectivity compared to the second etching stop layer, and the first insulating layer has an etch selectivity compared to the first etching stop layer and the second insulating layer. The second etching stop layer and the first etching stop layer are patterned using the photoresist structure as a mask to form a pre-second etching stop pattern and a pre-first etching stop pattern. The oxide semiconductor layer is patterned to Rum an oxide semiconductor pattern. An ashing process is performed to remove the thin portion of the photoresist structure and retain a portion of the thick portion. The pre-second etching stop pattern is patterned using the portion of the thick portion as a mask to form a second etching stop pattern. The second etching stop pattern exposes a portion of the pre-first etching stop pattern and a portion of the second insulating layer not covered by the oxide semiconductor pattern. The pre-first etching stop pattern is patterned using the portion of the thick portion as a mask to form a first etching stop pattern, and a portion of the second insulating layer not covered by the oxide semiconductor pattern is removed to form an insulating pattern. A source and a drain are formed on the first etching stop pattern and the second etching stop pattern. The source and the drain are electrically connected to two sides of the oxide semiconductor pattern respectively.

The invention provides a thin film transistor disposed on a substrate. The thin film transistor includes a gate disposed on the substrate, a first insulating layer covering the gate and the substrate, an insulating pattern disposed on the first insulating layer and above the gate, an oxide semiconductor pattern disposed on the insulating pattern, a first etching stop pattern disposed on the oxide semiconductor pattern and exposing two sides of the oxide semiconductor pattern, a second etching stop pattern disposed on the first etching stop pattern and exposing the two sides of the oxide semiconductor pattern, a source and a drain disposed on the first etching stop pattern and the second etching stop pattern and electrically connected to the two sides of the oxide semiconductor pattern respectively. Particularly, the first etching stop pattern and the insulating pattern have an etch selectivity compared to the second etching stop pattern, and the first insulating layer has an etch selectivity compared to the insulating pattern and the first etching stop pattern.

According to an embodiment of the invention, a material of the first insulating layer and a material of the second etching stop layer are the same, a material of the second insulating layer and a material of the first etching stop layer are the same, and the material of the first insulating layer and the material of the second insulating layer are different.

According to an embodiment of the invention, a material of the first insulating layer and a material of the second etching stop layer are silicon nitride, and a material of the second insulating layer and a material of the first etching stop layer are silicon oxide.

According to an embodiment of the invention, a material of the first insulating layer and a material of the second etching stop layer are silicon nitride, and a material of the second insulating layer and a material of the first etching stop layer are silicon oxide. The step of patterning the pre-second etching stop pattern to form the second etching stop pattern is that the pre-second etching stop pattern is patterned using a dry etching process to form the second etching stop pattern, wherein an etching gas used in the dry etching process includes chlorine and oxygen.

According to an embodiment of the invention, a material of the first insulating layer and a material of the second etching stop layer are silicon nitride, and a material of the second insulating layer and a material of the first etching stop layer are silicon oxide. The step of patterning the pre-first etching stop pattern to form the first etching stop pattern is that the pre-first etching stop pattern is patterned using a dry etching process to form the first etching stop pattern, wherein an etching gas used in the dry etching process includes disulfur difluoride.

According to an embodiment of the invention, the first etching stop pattern is coincided with the second etching stop pattern.

According to an embodiment of the invention, the oxide semiconductor pattern is coincided with the insulating pattern.

According to an embodiment of the invention, the first insulating layer, the insulating pattern, the oxide semiconductor pattern, the first etching stop pattern, and the second etching stop pattern are sequentially stacked in a direction away from the gate.

Based on the above, in the manufacturing method of the thin film transistor of an embodiment of the invention, since the first etching stop layer and the second insulating layer have an etch selectivity compared to the second etching stop layer, the pre-first etching stop pattern and the second insulating layer are not easily damaged in the process of patterning the second etching stop layer to Run the second etching stop pattern. The second insulating layer covers the first insulating layer, such that the first insulating layer is not damaged in the process of forming the second etching stop pattern. Additionally, since the first insulating layer has an etch selectivity compared to the first etching stop layer and the second insulating layer, the first insulating layer is not easily damaged and will be retained in the process of patterning the first etching stop layer and the second insulating layer to form the first etching stop pattern and the insulating pattern. Thus, the production of the thin film transistor is high.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1A:
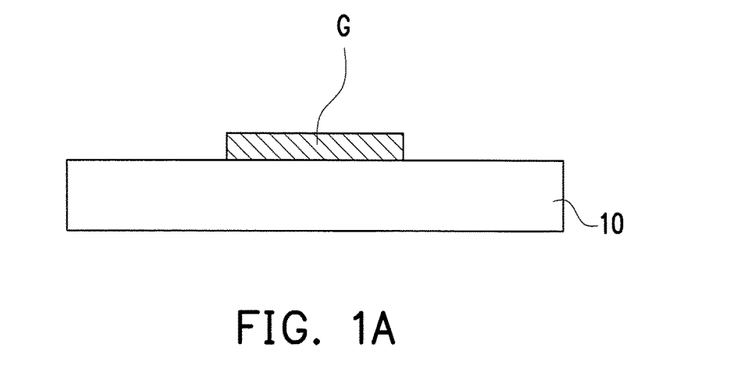
FIG. 1A to FIG. 1O are schematic cross-sectional views of a manufacturing process of a thin film transistor according to an embodiment of the invention.
Figure 1B:
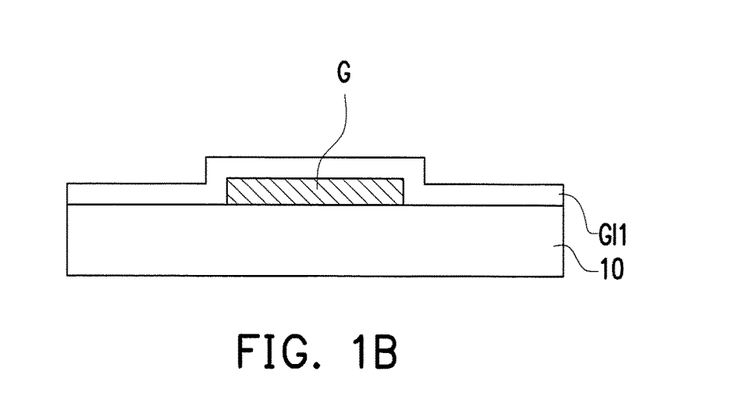
Figure 1C:
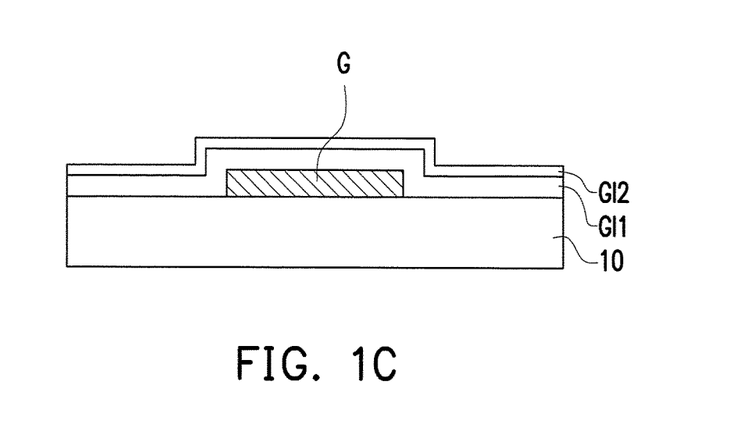
Figure 1D:
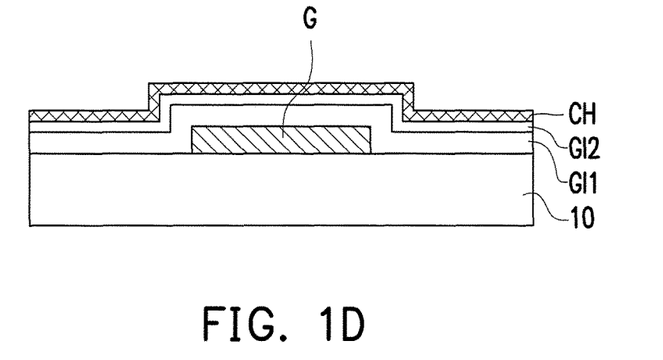
Figure 1E:
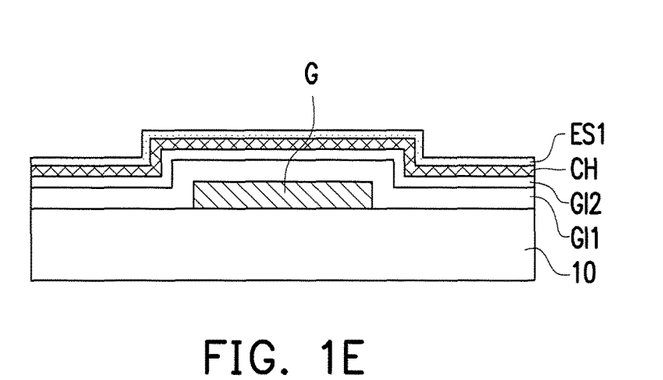
Figure 1F:
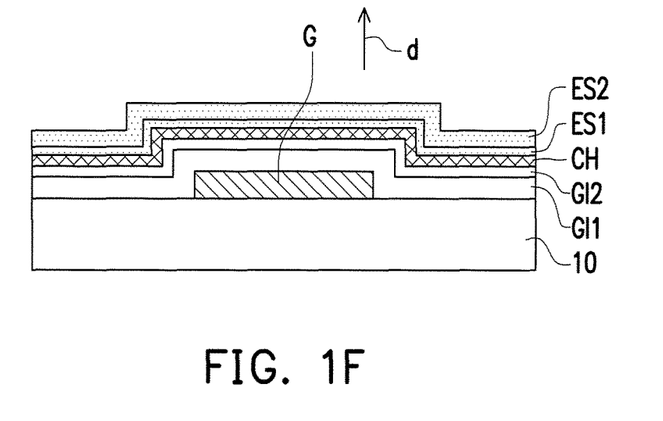
Figure 1G:
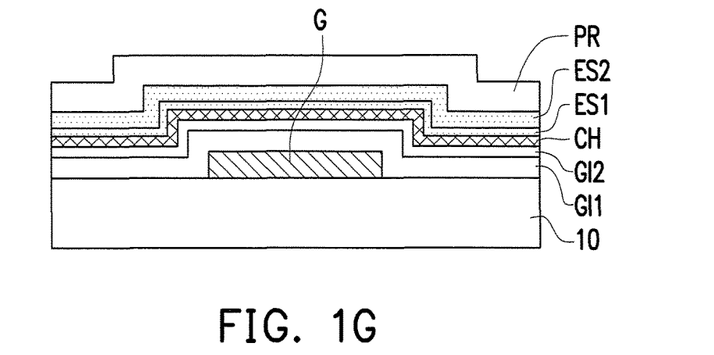
Figure 1H:
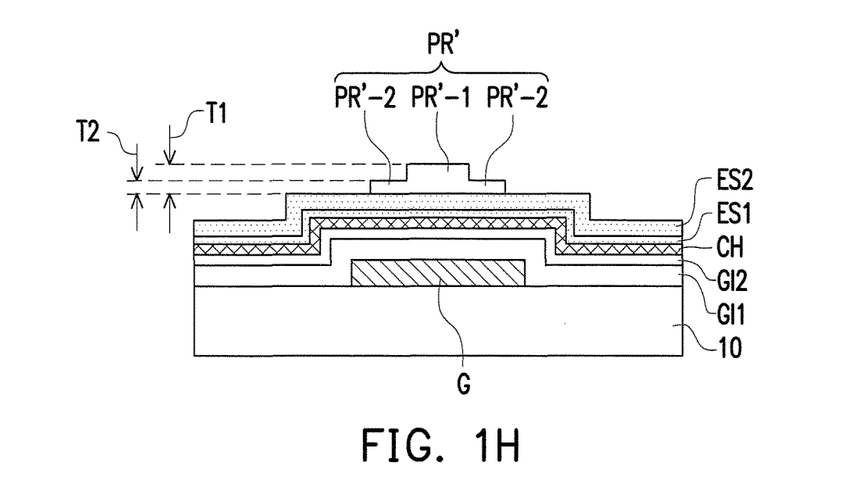
Figure 1I:
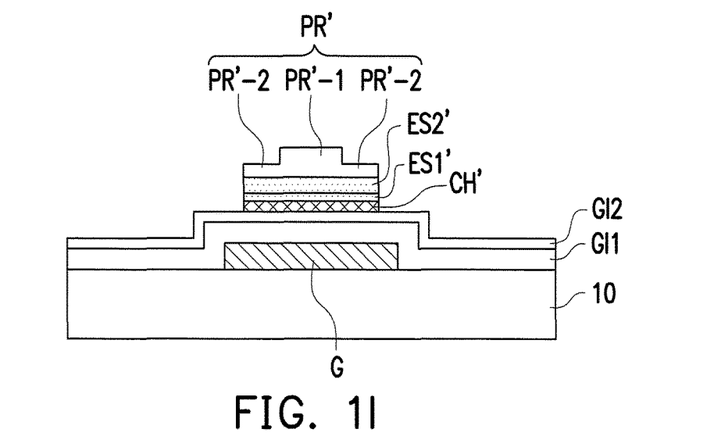
Figure 1J:
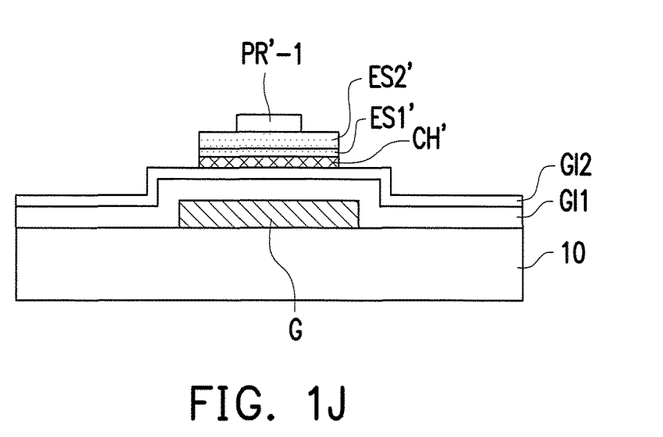
Figure 1K:
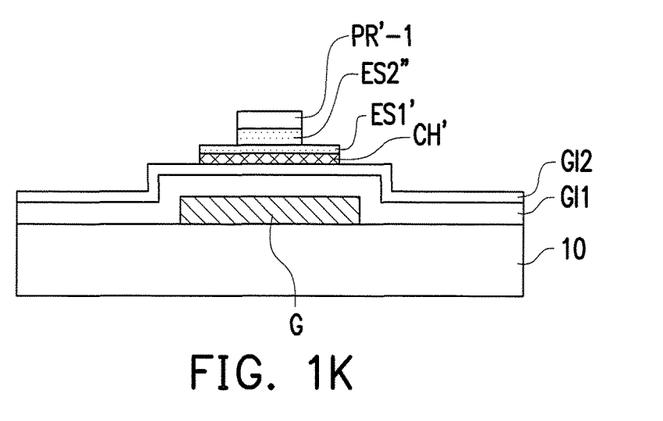
Figure 1L:
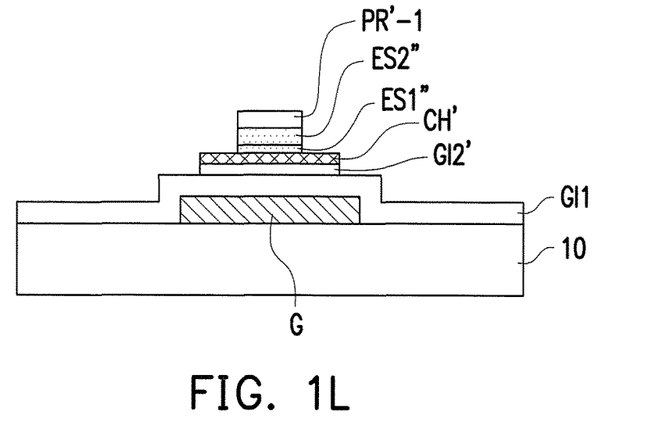
Figure 1M:
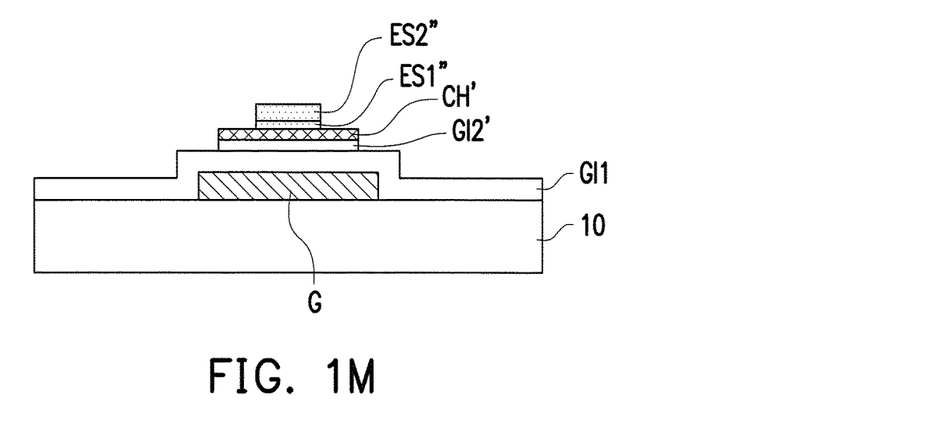
Figure 1N:
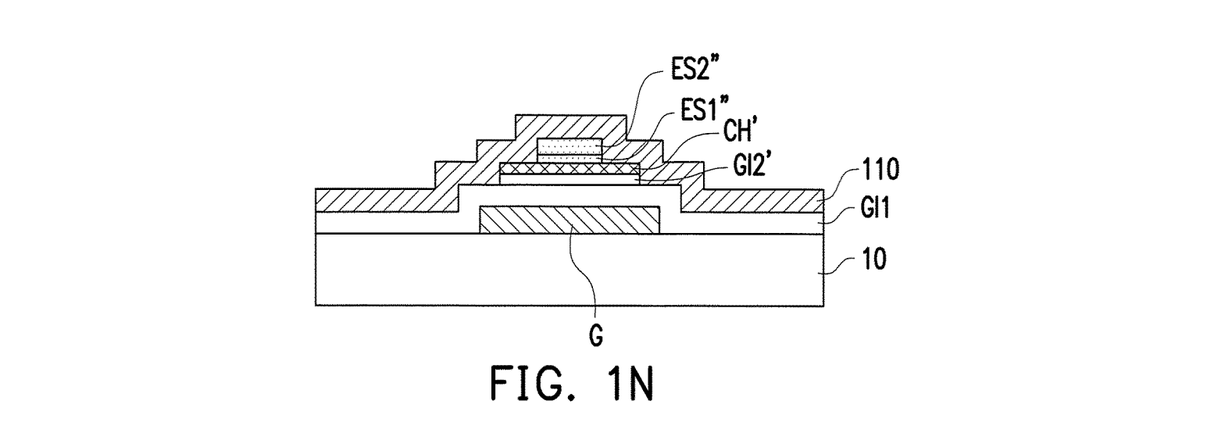
Figure 1O:
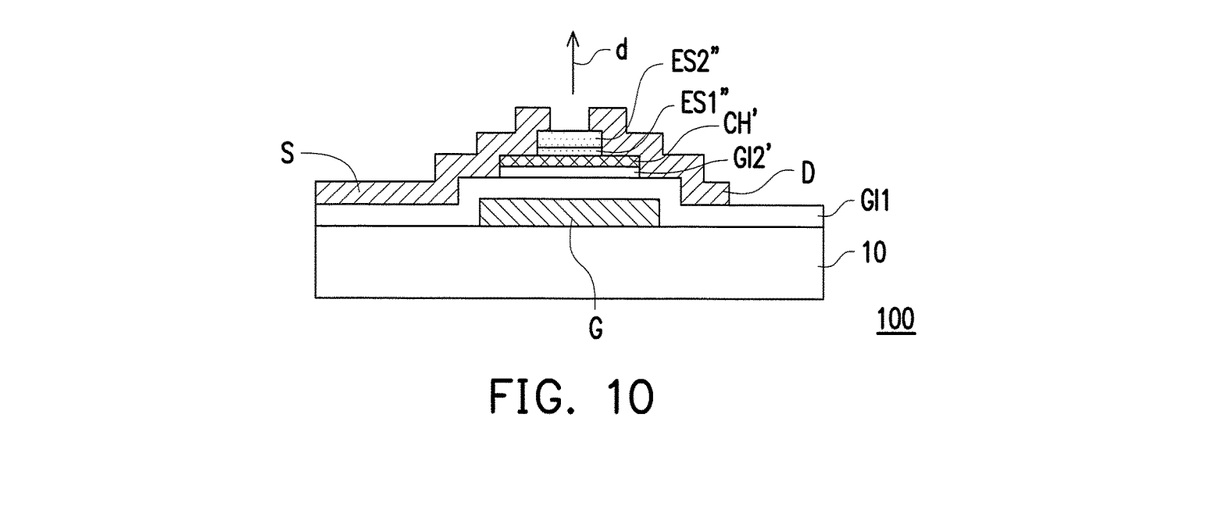

FIG. 1A to FIG. 1O are schematic cross-sectional views of a manufacturing process of a thin film transistor according to an embodiment of the invention. Referring to FIG. 1A, first, a substrate 10 is provided. In the embodiment, a material of the substrate 10 can be glass, quartz, organic polymer, a non-light-transmissive/reflective material (e.g., a conductive material, wafer, ceramics, or the like), or other suitable materials. Next, a gate G is formed on the substrate 10. In the embodiment, the gate G can be made of a metal material. However, the invention is not limited thereto. In other embodiments, the gate G can also be made of other conductive materials, such as an alloy, a metal nitride material, a metal oxide material, a metal oxynitride material, or a stacked layer of a metal material and other conductive materials.

Referring to FIG. 1B, then, a first insulating layer GI1 is formed on the substrate 10 to cover the gate G and the substrate 10. In the embodiment, the first insulating layer GI1 can completely cover the gate G and a portion of the substrate 10 outside of the gate G. However, the invention is not limited thereto. Referring to FIG. 1C, then, a second insulating layer GI2 is formed on the first insulating layer GI1. In the embodiment, the second insulating layer GI2 can completely cover the first insulating layer GI1. However, the invention is not limited thereto.

Referring to FIG. 1D, then, an oxide semiconductor layer CH is formed on the second insulating layer GI2. In the embodiment, the oxide semiconductor layer CH can completely cover the second insulating layer GI2. However, the invention is not limited thereto. In the embodiment, a material of the oxide semiconductor layer CH can be a metal oxide semiconductor or other suitable materials. The metal oxide semiconductor is indium-gallium-zinc oxide (IGZO), zinc oxide (ZnO), tin oxide (SnO), indium-zinc oxide (IZO), gallium-zinc oxide (GZO), zinc-tin oxide (ZTO), indium-tin oxide (ITO), or other suitable materials, for example.

Referring to FIG. 1E, then, a first etching stop layer ES1 is formed on the oxide semiconductor layer CH. In the embodiment, the first etching stop layer ES1 can completely cover the oxide semiconductor layer CH. However, the invention is not limited thereto. Referring to FIG. 1F, then, a second etching stop layer ES2 is formed on the first etching stop layer ES1. In the embodiment, the second etching stop layer ES2 can completely cover the first etching stop layer ES1. However, the invention is not limited thereto. The first insulating layer GI1, the second insulating layer GI2, the oxide semiconductor layer CH, the first etching stop layer ES1, and the second etching stop layer ES2 are sequentially stacked in a direction d away from the gate G.

It should be noted that the first etching stop layer ES1 and the second insulating layer GI2 have an etch selectivity compared to the second etching stop layer ES2, and the first insulating layer GI1 has an etch selectivity compared to the first etching stop layer ES1 and the second insulating layer GI2. Furthermore, in the embodiment, a material of the first insulating layer GI1 and a material of the second etching stop layer ES2 may be the same. A material of the second insulating layer GI2 and a material of the first etching stop layer ES1 may be the same. The material of the first insulating layer GI1 and the material of the second insulating layer GI2 are different. For example, the material of the first insulating layer GI1 and the material of the second etching stop layer ES2 may be silicon nitride ($SiN_x$), wherein 1.2≤x≤1.5, and the material of the second insulating layer GI2 and the material of the first etching stop layer ES1 may be silicon oxide ($SiO_2$).

Referring to FIG. 1G, then, a photoresist layer PR is formed on the second etching stop layer ES2. Referring to FIG. 1H, then, the photoresist layer PR is patterned to form a photoresist structure PR'. Particularly, the photoresist layer PR can be patterned using a half tone mask as a mask to form the photoresist structure PR' having a thick portion PR'-1 and thin portions PR'-2. A thickness T1 of the thick portion PR'-1 is larger than a thickness T2 of the thin portion PR'-2. In the embodiment, the thin portions PR'-2 can be located at two opposite sides of the thick portion PR'-1 and connected to the thick portion PR'-1. However, the invention is not limited thereto.

Referring to FIG. 1H and FIG. 1I, then, the second etching stop layer ES2 and the first etching stop layer ES1 are patterned using the photoresist structure PR' as a mask to form a pre-second etching stop pattern ES2' and a pre-first etching stop pattern ES1'. For example, in the embodiment, a portion of the second etching stop layer ES2 not covered by the photoresist structure PR' and a portion of the first etching stop layer ES1 not covered by the photoresist structure PR' can be removed using the same dry etching process to form the pre-second etching stop pattern ES2' and the pre-first etching stop pattern ES1', wherein an etching gas used in the dry etching process includes sulphur hexafluoride ($SF_6$) and oxygen ($O_2$). As shown in FIG. 1I, the pre-second etching stop pattern ES2' is substantially coincided with the pre-first etching stop pattern ES1'. In other words, a profile of the pre-second etching stop pattern ES2' is substantially the same as and aligned with a profile of the pre-first etching stop pattern ES1'. However, the invention is not limited thereto. In other embodiments, the pre-second etching stop pattern ES2' and the pre-first etching stop pattern ES1' can also be formed using other methods. For example, in another embodiment of the invention, the portion of the first etching stop layer ES1 not covered by the photoresist structure PR' can also be removed by the dry etching process using an etching gas including tetrafluoromethane ($CF_4$) and oxygen ($O_2$).

Referring to FIG. 1H and FIG. 1I, then, the oxide semiconductor layer CH is patterned using the photoresist structure PR' as a mask to form an oxide semiconductor pattern CH'. The pre-second etching stop pattern ES2' and the pre-first etching stop pattern ES1' are substantially coincided with the oxide semiconductor pattern CH'. In other words, the profile of the pre-second etching stop pattern ES2' and the profile of the pre-first etching stop pattern ES1' are substantially the same as and aligned with a profile of the oxide semiconductor pattern CH'. For example, in the embodiment, a portion of the oxide semiconductor layer CH not covered by the photoresist structure PR' can be removed using a wet etching process to from the oxide semiconductor pattern CH'. An etching solution used in the wet etching process is oxalic acid, for example. However, the invention is not limited thereto.

Referring to FIG. 1I and FIG. 1J, then, an ashing process is performed to remove the thin portion PR'-2 and retain a portion of the thick portion PR'-1 of the photoresist structure PR'. As shown in FIG. 1J, the remaining thick portion PR'-1 of the photoresist structure PR' exposes a portion of the pre-second etching stop pattern ES2'. Referring to FIG. 1J and FIG. 1K, then, the pre-second etching stop pattern ES2' is patterned using the remaining thick portion PR'-1 of the photoresist structure PR' as a mask to form a second etching stop pattern ES2". For example, in the embodiment, the pre-second etching stop pattern ES2' can be patterned using a dry etching process to foul' the second etching stop pattern ES2", wherein an etching gas used in the dry etching process includes chlorine ($Cl_2$) and oxygen ($O_2$).

Referring to FIG. 1J and FIG. 1K, it should be noted that, since the first etching stop layer ES1 and the second insulating layer GI2 have an etch selectivity compared to the second etching stop layer ES2 (that is, the pre-first etching stop pattern ES1' and the second insulating layer GI2 have an etch selectivity compared to the pre-second etching stop pattern ES2'), the pre-first etching stop pattern ES1' and the second insulating layer GI2 are not easily damaged and will be retained in the process of removing the portion of the pre-second etching stop pattern ES2' to form the second etching stop pattern ES2". Since the second insulating layer GI2 is retained and covers the first insulating layer GI1, the first insulating layer GI1 is not damaged in the process of removing the portion of the pre-second etching stop pattern ES2' to form the second etching stop pattern ES2". Thus, the production of a thin film transistor 100 which is subsequently formed is high.

Referring to FIG. 1K and FIG. 1L, then, the pre-first etching stop pattern ES1' is patterned using the remaining thick portion PR'-1 of the photoresist structure PR' as a mask to form a first etching stop pattern ES1". As shown in FIG. 1L, in the embodiment, the first etching stop pattern ES1" is substantially coincided with the second etching stop pattern ES2". In other words, a profile of the first etching stop pattern ES1" is substantially the same as and aligned with a profile of the second etching stop pattern ES2". For example, in the embodiment, the pre-first etching stop pattern ES1' can be patterned using a dry etching process to form the first etching stop pattern ES1", wherein an etching gas used in the dry etching process includes disulfur difluoride ($S_2F_2$). However, the invention is not limited thereto.

Referring to FIG. 1K and FIG. 1L, in the embodiment, in the process of removing the pre-first etching stop pattern ES1' to form the first etching stop pattern ES1", a portion of the second insulating layer GI2 not covered by the oxide semiconductor pattern CH' can also be removed together to form an insulating pattern GI2'. The oxide semiconductor pattern CH' is substantially coincided with the insulating pattern GI2'. In other words, a profile of the oxide semiconductor pattern CH' is substantially the same as and aligned with a profile of the insulating pattern GI2'. The first insulating layer GI1, the insulating pattern GI2', the oxide semiconductor pattern CH', the first etching stop pattern ES1" and the second etching stop pattern ES2" are sequentially stacked in the direction d away from the gate G.

Referring to FIG. 1K and FIG. 1L, it should be noted that, since the first insulating layer GI1 has an etch selectivity compared to the first etching stop layer ES1 and the second insulating layer GI2 (that is, the first insulating layer GI1 has an etch selectivity compared to the pre-first etching stop pattern ES1' and the second insulating layer GI2), the first insulating layer GI1 is not easily damaged and will be retained in the process of removing the portion of the pre-first etching stop pattern ES1' and the portion of the second insulating layer GI2 to form the first etching stop pattern ES1" and the insulating pattern GI2'. Thus, the thin film transistor 100 subsequently formed has high yield.

Referring to FIG. 1L and FIG. 1M, then, the remaining thick portion PR'-1 of the photoresist structure PR' can be selectively removed. Referring to FIG. 1N, then, a conductive layer 110 can be formed to cover the second etching stop pattern ES2", the first etching stop pattern ES1", the oxide semiconductor pattern CH', the insulating pattern GI2', and the portion of the first insulating layer GI1 not covered by the insulating pattern GI2'. In the embodiment, the conductive layer 110 is generally made of a metal material. However, the invention is not limited thereto. In other embodiments, the conductive layer 110 can also be made of other conductive materials, such as an alloy, a metal nitride material, a metal oxide material, a metal oxynitride material, or a stacked layer of a metal material and other conductive materials.

Referring to FIG. 1N and FIG. 1O, then, the conductive layer 110 is patterned to form a source S and a drain D on the first etching stop pattern ES1" and the second etching stop pattern ES2". The source S and the drain D are electrically connected to two sides of the oxide semiconductor pattern CH' respectively. When removing the portion of the conductive layer 110 located on the second etching stop pattern ES2" to form the source S and the drain D, the first etching stop pattern ES1" and the second etching stop pattern ES2" can protect the oxide semiconductor pattern CH' from being damaged. Herein, the thin film transistor 100 is completed.

Referring to FIG. 1O, the thin film transistor 100 includes the gate G disposed on the substrate 10, the first insulating layer GI1 covering the gate G and the substrate 10, the insulating pattern GI2' disposed on the first insulating layer GI1 and above the gate G, the oxide semiconductor pattern CH' disposed on the insulating pattern GI2', the first etching stop pattern ES1" disposed on the oxide semiconductor pattern CH' and exposing the two sides of the oxide semiconductor pattern CH', the second etching stop pattern ES2" disposed on the first etching stop pattern ES1" and exposing the two sides of the oxide semiconductor pattern CH', and the source S and the drain D disposed on the first etching stop pattern ES1" and the second etching stop pattern ES2" and electrically connected to the two sides of the oxide semiconductor pattern CH' respectively. Particularly, the first etching stop pattern ES1" and the insulating pattern GI2' have an etch selectivity compared to the second etching stop pattern ES2", and the first insulating layer GI1 has an etch selectivity compared to the insulating pattern GI2' and the first etching stop pattern ES1".

In the embodiment, the material of the first insulating layer GI1 and the material of the second etching stop pattern ES2" may be the same. The material of the insulating pattern GI2' and the material of the first etching stop pattern ES1" may be the same. The material of the first insulating layer GI1 and the material of the insulating pattern GI2' are different. For example, in the embodiment, the material of the first insulating layer GI1 and the material of the second etching stop pattern ES2" may be silicon nitride ($SiN_x$), and the material of the insulating pattern GI2' and the material of the first etching stop pattern ES1" may be silicon oxide ($SiO_2$). In another embodiment, the first insulating layer GI1, the insulating pattern GI2', the first etching stop pattern ES1", and the second etching stop pattern ES2" may also be other suitable materials.

In summary, in the manufacturing method of the thin film transistor of an embodiment of the invention, since the first etching stop layer and the second insulating layer have an etch selectivity compared to the second etching stop layer, the pre-first etching stop pattern and the second insulating layer are not easily damaged in the process of patterning the second etching stop layer to form the second etching stop pattern. The second insulating layer covers the first insulating layer, such that the first insulating layer is not damaged in the process of forming the second etching stop pattern. Additionally, since the first insulating layer has an etch selectivity compared to the first etching stop layer and the second insulating layer, the first insulating layer is not easily damaged and will be retained in the process of patterning the first etching stop layer and the second insulating layer to form the first etching stop pattern and the insulating pattern. Thus, the production of the thin film transistor is high.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a thin film transistor, comprising:
    forming a gate on a substrate;
    forming a first insulating layer, a second insulating layer, an oxide semiconductor layer, a first etching stop layer, a second etching stop layer and a photoresist structure on the substrate and the gate sequentially, the photoresist structure having a thick portion and a thin portion, wherein the first etching stop layer and the second insulating layer have an etch selectivity compared to the second etching stop layer, and the first insulating layer has an etch selectivity compared to the first etching stop layer and the second insulating layer;
    patterning the second etching stop layer and the first etching stop layer using the photoresist structure as a mask to form a pre-second etching stop pattern and a pre-first etching stop pattern;
    patterning the oxide semiconductor layer to form an oxide semiconductor pattern;
    performing an ashing process to remove the thin portion and retain a portion of the thick portion of the photoresist structure;
    patterning the pre-second etching stop pattern using the portion of the thick portion as a mask to form a second etching stop pattern, the second etching stop pattern exposing a portion of the pre-first etching stop pattern and a portion of the second insulating layer not covered by the oxide semiconductor pattern;
    patterning the pre-first etching stop pattern using the portion of the thick portion as a mask to form a first etching stop pattern, and removing the portion of the second insulating layer not covered by the oxide semiconductor pattern to form an insulating pattern; and
    forming a source and a drain on the first etching stop pattern and the second etching stop pattern, the source and the drain being electrically connected to two sides of the oxide semiconductor pattern respectively.

2. The manufacturing method of the thin film transistor according to claim 1, wherein a material of the first insulating layer and a material of the second etching stop layer are the same, a material of the second insulating layer and a material of the first etching stop layer are the same, and the material of the first insulating layer and the material of the second insulating layer are different.

3. The manufacturing method of the thin film transistor according to claim 1, wherein a material of the first insulating layer and a material of the second etching stop layer are silicon nitride, a material of the second insulating layer and a material of the first etching stop layer are silicon oxide, and the step of patterning the pre-second etching stop pattern to form the second etching stop pattern is:

patterning the pre-second etching stop pattern using a dry etching process to form the second etching stop pattern, wherein an etching gas used in the dry etching process comprises chlorine and oxygen.

4. The manufacturing method of the thin film transistor according to claim 1, wherein a material of the first insulating layer and a material of the second etching stop layer are silicon nitride, a material of the second insulating layer and a material of the first etching stop layer are silicon oxide, and the step of patterning the pre-first etching stop pattern to form the first etching stop pattern is:

patterning the pre-first etching stop pattern using a dry etching process to form the first etching stop pattern, wherein an etching gas used in the dry etching process comprises disulfur difluoride.

5. A thin film transistor disposed on a substrate, comprising:
a gate, disposed on the substrate;
a first insulating layer covering the gate and the substrate;
an insulating pattern, disposed on the first insulating layer and above the gate;
an oxide semiconductor pattern, disposed on the insulating pattern;
a first etching stop pattern, disposed on the oxide semiconductor pattern and exposing two sides of the oxide semiconductor pattern;
a second etching stop pattern, disposed on the first etching stop pattern and exposing the two sides of the oxide semiconductor pattern;
a source and a drain, disposed on the first etching stop pattern and the second etching stop pattern and being electrically connected to the two sides of the oxide semiconductor pattern respectively, wherein the first etching stop pattern and the insulating pattern have an etch selectivity compared to the second etching stop pattern, and the first insulating layer has an etch selectivity compared to the insulating pattern and the first etching stop pattern, wherein a material of the first insulating layer and a material of the second etching stop pattern are the same, a material of the insulating pattern and a material of the first etching stop pattern are the same, and a material of the first insulating layer and a material of the insulating pattern are different.

6. The thin film transistor according to claim 5, wherein a material of the first insulating layer and a material of the second etching stop pattern are silicon nitride, and a material of the insulating pattern and a material of the first etching stop pattern are silicon oxide.

7. The thin film transistor according to claim 5, wherein the first etching stop pattern is coincided with the second etching stop pattern.

8. The thin film transistor according to claim 5, wherein the oxide semiconductor pattern is coincided with the insulating pattern.

9. The thin film transistor according to claim 5, wherein the first insulating layer, the insulating pattern, the oxide semiconductor pattern, the first etching stop pattern, and the second etching stop pattern are sequentially stacked in a direction away from the gate.

* * * * *